United States Patent
Yokokawa et al.

(10) Patent No.: US 7,959,731 B2
(45) Date of Patent: Jun. 14, 2011

(54) METHOD FOR PRODUCING SEMICONDUCTOR WAFER

(75) Inventors: Isao Yokokawa, Gunma (JP); Hiroji Aga, Gunma (JP); Kiyoshi Mitani, Gunma (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 1084 days.

(21) Appl. No.: 11/665,977

(22) PCT Filed: Nov. 2, 2005

(86) PCT No.: PCT/JP2005/020185
§ 371 (c)(1),
(2), (4) Date: Apr. 23, 2007

(87) PCT Pub. No.: WO2006/051730
PCT Pub. Date: May 18, 2006

(65) Prior Publication Data
US 2008/0138959 A1    Jun. 12, 2008

(30) Foreign Application Priority Data
Nov. 10, 2004 (JP) ................................ 2004-326156

(51) Int. Cl.
*C30B 25/22* (2006.01)
(52) U.S. Cl. ................ 117/84; 117/89; 117/90; 117/94; 117/915
(58) Field of Classification Search ................. 117/915, 117/84, 89, 90, 94
See application file for complete search history.

(56) References Cited

U.S. PATENT DOCUMENTS

| | | |
|---|---|---|
| 2004/0126958 A1 | 7/2004 | Usuda et al. |
| 2004/0157409 A1 | 8/2004 | Ghyselen et al. |

FOREIGN PATENT DOCUMENTS

| | | |
|---|---|---|
| JP | A 2001-217430 | 8/2001 |
| JP | A 2001-284558 | 10/2001 |
| JP | A 2003-17705 | 1/2003 |
| WO | WO 02/43153 A1 | 5/2002 |
| WO | WO 03/046992 A1 | 6/2003 |
| WO | WO 2004/006327 A2 | 1/2004 |

OTHER PUBLICATIONS

51th Applied Physics Related Association Lecture Meetings, Lecture Abstracts, 28p-ZZ-6, p. 22.
51th Applied Physics Related Association Lecture Meetings, Lecture Abstracts, 30a-YL-10, p. 414.
Christophe Maleville et al., "Smart-Cut® technology: from 300 mm ultrathin SOI production to advanced engineered substrates," Solid-State Electronics, vol. 48, No. 6, Jun. 2004, pp. 1055-1063.

*Primary Examiner* — Robert M Kunemund
(74) *Attorney, Agent, or Firm* — Oliff & Berridge, PLC

(57) ABSTRACT

A method for producing a semiconductor wafer, including epitaxially growing a $Si_{1-X}Ge_X$ layer ($0 < X \leq 1$) on a surface of a silicon single crystal wafer to be a bond wafer; implanting at least one kind of a hydrogen ion or a rare gas ion through the $Si_{1-X}Ge_X$ layer and forming an ion-implanted layer inside the bond wafer; contacting and bonding a surface of the $Si_{1-X}Ge_X$ layer and a surface of a base wafer through an insulator film; then performing delamination at the ion-implanted layer; performing a bonding heat treatment of binding the bonded surfaces; and then removing a Si layer of a delaminated layer transferred to a side of the base wafer by the delamination. Thereby, the method does not cause lattice relaxation in the SiGe layer. Therefore, the method is suitable for production of a semiconductor wafer for high-speed semiconductor devices.

13 Claims, 1 Drawing Sheet

METHOD FOR PRODUCING SEMICONDUCTOR WAFER

TECHNICAL FIELD

The present invention relates to a method for producing a semiconductor wafer such as an SGOI wafer or a GOI wafer in which a $Si_{1-X}Ge_X$ layer ($0<X\leq 1$) is formed on an insulator.

BACKGROUND ART

In recent years, in order to satisfy requirement for enhancing performance of semiconductor devices, it has been proposed to use a semiconductor wafer in which a $Si_{1-X}Ge_X$ layer ($0<X\leq 1$) is epitaxially grown on a surface of a silicon single crystal. For example, a semiconductor device such as a high-speed MOSFET (Metal-Oxide-Semiconductor Field Effect Transistor) in which the $Si_{1-X}Ge_X$ layer is used in a channel region has been proposed.

In this case, because $Si_{1-X}Ge_X$ crystal has a larger lattice constant than that of Si crystal, strain (compression strain) is generated in a crystal lattice of the $Si_{1-X}Ge_X$ layer that is epitaxially grown on a surface of a silicon single crystal. By its strain stress, an energy band structure of the $Si_{1-X}Ge_X$ crystal is changed and therefore, degeneracy of the energy band is solved and an energy band having a high carrier mobility is formed. In the $Si_{1-X}Ge_X$ layer having strain, particularly, its hole mobility becomes high and therefore, high-speed operating characteristics are expected in the MOSFET in which the $Si_{1-X}Ge_X$ layer is used in a channel region. Here, the $Si_{1-X}Ge_X$ layer has a Ge concentration of more than 0% and contains a Ge layer having a Ge concentration of 100% and hereinafter, will be occasionally described simply as SiGe layer.

As a method for forming such a SiGe layer, there has been disclosed an oxidation enrichment method in which a SiGe layer is epitaxially grown on an SOI (Silicon On Insulator) wafer and then, its surface is thermally oxidized in an oxygen atmosphere and thereby, Ge is enriched and a SiGe layer having a high Ge concentration is formed (See, 51th Applied Physics Related Association Lecture Meeting, Lecture Abstracts, 28p-ZZ-6, p. 22, 51th Applied Physics Related Association Lecture Meeting, Lecture Abstracts, 30a-YL-10, p. 414). It has been supposed that according to this method, a SiGe layer having a high Ge concentration and a thin thickness can be formed.

Hereinafter, such a wafer in which a SiGe layer is formed on an insulator will be occasionally described as an SGOI (SiGe On Insulator) wafer and, a wafer in which a Ge layer having a 100% Ge concentration is formed will be occasionally described as a GOI (Ge On Insulator) wafer.

DISCLOSURE OF THE INVENTION

An object of the present invention is to provide a method for producing a semiconductor wafer that is suitable for production of high-speed semiconductor devices because in the SGOI wafer or the GOI wafer, lattice relaxation that is an phenomenon that a lattice constant of the SiGe layer having lattice strain comes close to the intrinsic lattice constant determined by the Ge concentration is not caused, and the lattice is sufficiently strained.

To achieve the above object, the present invention provides a method for producing a semiconductor wafer, comprising: at least
  epitaxially growing a $Si_{1-X}Ge_X$ layer ($0<X\leq 1$) on a surface of a silicon single crystal wafer to be a bond wafer;
  implanting at least one kind of a hydrogen ion or a rare gas ion through the $Si_{1-X}Ge_X$ layer and thereby, forming an ion-implanted layer inside the bond wafer;
  closely contacting and bonding a surface of the $Si_{1-X}Ge_X$ layer and a surface of a base wafer through an insulator film; then
  performing a delamination treatment of performing delamination at the ion-implanted layer;
  performing a bonding heat treatment of binding the bonded surfaces at a temperature of, at least, more than or equal to a temperature when the delamination treatment is performed; and then
  removing a Si layer of a delaminated layer transferred to a side of the base wafer by the delamination.

As described above, when an SGOI wafer or the like is produced, there is used an ion implantation delamination method in a bonding method, in which a $Si_{1-X}Ge_X$ layer is epitaxially grown on a surface of a silicon single crystal wafer to be a bond wafer, then at least one kind of a hydrogen ion or a rare gas ion is implanted through the $Si_{1-X}Ge_X$ layer and thereby, forming an ion-implanted layer inside the bond wafer, then a surface of the $Si_{1-X}Ge_X$ layer and a surface of a base wafer are closely contacted and bonded through an insulator film, and then a delamination treatment of conducting delamination at the ion-implanted layer in a bond wafer is performed. In this case, lattice strain is generated in the $Si_{1-X}Ge_X$ layer. However, the lattice strain is not relaxed because the ion-implanted layer is formed inside the bond wafer and then a part of the wafer is transferred as a Si layer in the delamination and thereby the $Si_{1-X}Ge_X$ layer transferred at the same time is bound to crystal lattice of the Si layer. When a bonding heat treatment is performed in the state at a temperature of more than or equal to a temperature in the delamination treatment, the bonded surfaces can be bound along with keeping the strain of the $Si_{1-X}Ge_X$ layer. Because the Si layer is removed after the bonded surfaces are bound as described above, thereafter, lattice relaxation is not caused in the $Si_{1-X}Ge_X$ layer and, a wafer having a sufficiently strained $Si_{1-X}Ge_X$ layer can be produced.

In addition, magnitude of the strain can be evaluated by lattice relaxation rate. The lattice relaxation rate is an amount that relatively represents an extent of lattice relaxation, in which the rate is set to 0% when the lattice constant of the SiGe layer is the same as the lattice constant of Si and the rate is set to 100% when the lattice constant of the SiGe layer is an intrinsic lattice constant determined by Ge concentration. It is more preferable that the lattice relaxation rate is lower because strain of the SiGe layer is larger.

In the above case, it is preferable that a thickness of the Si layer of the delaminated layer is more than or equal to five times a thickness of the $Si_{1-X}Ge_X$ layer.

When a thickness of the Si layer of the delaminated layer is more than or equal to five times a thickness of the $Si_{1-X}Ge_X$ layer, the $Si_{1-X}Ge_X$ layer is strongly bound to lattice of the Si layer and the strain can be sufficiently kept.

Moreover, it is preferable that the bonding heat treatment is performed at a temperature of 500° C.~1100° C.

When the bonding heat treatment is performed at 500° C. or more, the bonding heat treatment has effect of improvement of the binding force, and when performed at 1100° C. or less, diffusion of Ge to the delaminated Si layer is suppressed, and degradation of Ge concentration of the $Si_{1-X}Ge_X$ layer is suppressed and therefore, the strain is not reduced, and also the interface of the SiGe layer/the Si layer is not broken and is clearly maintained, and the subsequent removal of the Si layer can be suitably performed.

Moreover, it is preferable that the bonding heat treatment is performed at a temperature of 600° C.~950° C.

When the bonding heat treatment is performed at 600° C. or more, the effect of improvement of binding force in the bonding heat treatment becomes more certainly, and if at 950° C. or less, localization due to dissolution and recrystallization of Ge is not caused even when the Ge concentration is high, the $Si_{1-X}Ge_X$ layer can have high crystallinity and be uniform.

Moreover, it is preferable that the bonding heat treatment is performed by using an RTA apparatus.

When the bonding heat treatment is performed by using an RTA (Rapid Thermal Anneal) apparatus by which high-speed heating and high-speed cooling can be performed, the diffusion of Ge can be certainly prevented, the strain of the $Si_{1-X}Ge_X$ layer is not reduced and so forth also the interface of the SiGe layer/the Si layer is not broken and clearly maintained and, the subsequent removal of the Si layer can be suitably performed.

Moreover, it is preferable that the Si layer of the delaminated layer is removed by etching.

When the Si layer of the delaminated layer is removed by etching, the removal that is uniform and has no surface roughness can be easily performed.

According to the present invention, when the SGOI wafer and so forth are produced, there is used an ion implantation delamination method in a bonding method, in which a $Si_{1-X}Ge_X$ layer is epitaxially grown on a surface of a silicon single crystal wafer to be a bond wafer, then at least one kind of a hydrogen ion or a rare gas ion is implanted through the $Si_{1-X}Ge_X$ layer and thereby, forming an ion-implanted layer inside the bond wafer, then a surface of the $Si_{1-X}Ge_X$ layer and a surface of a base wafer are closely contacted and bonded through an insulator film, and then a delamination treatment of conducting delamination at the ion-implanted layer is performed. A part of the wafer is also transferred as a Si layer in the delamination and thereby, the $Si_{1-X}Ge_X$ layer transferred at the same time is bound to crystal lattice of the Si layer and therefore, the lattice strain is not relaxed. Therefore, when a bonding heat treatment is performed in the state at a temperature of more than or equal to a temperature in the delamination treatment, the bonded surfaces can be firmly bound along with keeping the strain of the $Si_{1-X}Ge_X$ layer. Because the Si layer is removed after the bonded surfaces are bound as described above, thereafter, lattice relaxation is suppressed and, a wafer having a sufficiently strained $Si_{1-X}Ge_X$ layer can be produced. The SGOI wafer or the like produced as described above has a SiGe layer with a low lattice relaxation rate and has sufficient large strain and therefore, serves as a wafer that is suitable for production of a semiconductor device having high hole mobility and high-speed operating characteristics.

BEST MODE FOR CARRYING OUT THE INVENTION

Figure 1:
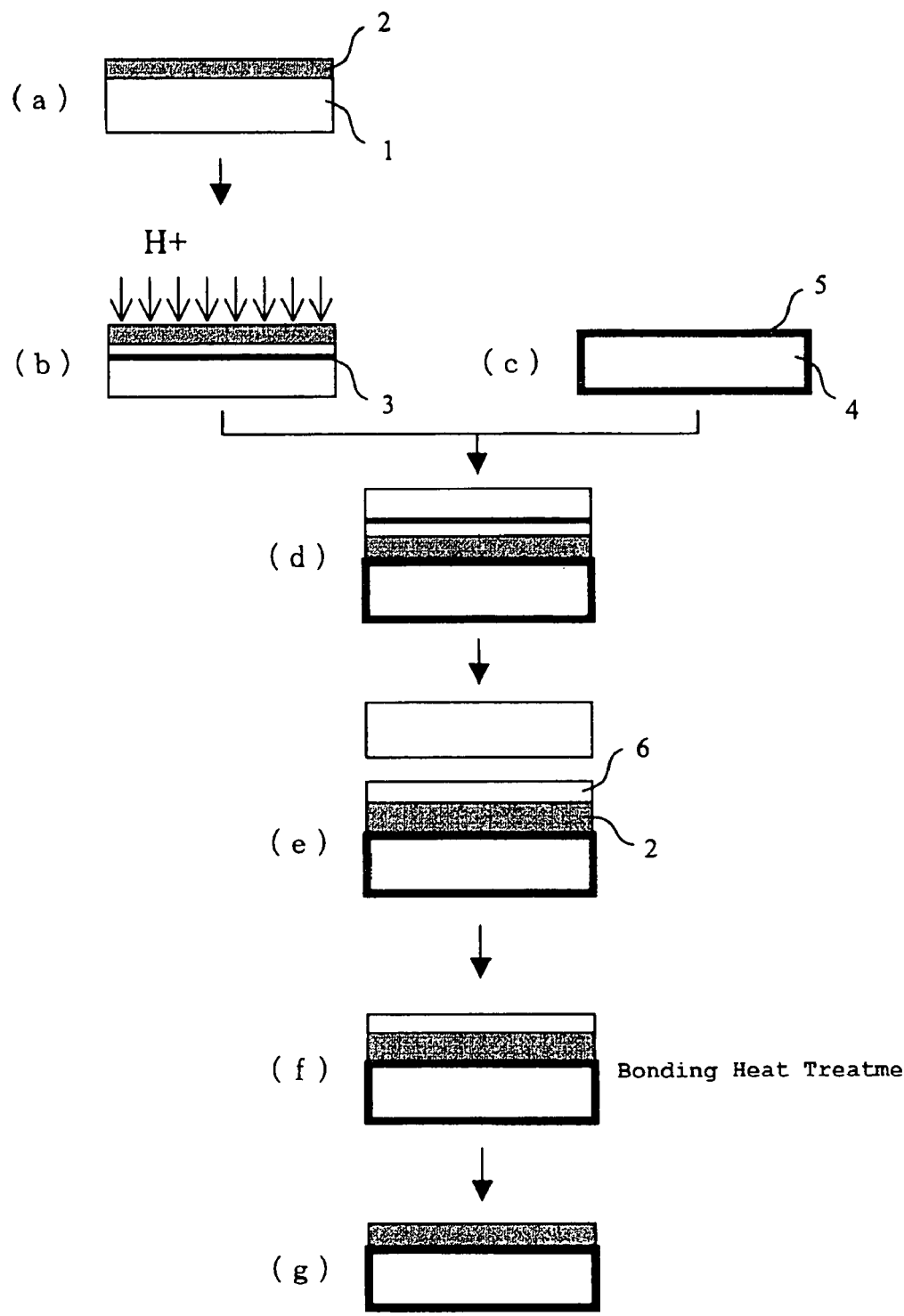
FIG. 1 is a view showing an example of a process for producing a semiconductor wafer according to an embodiment of the present invention.

Hereinafter, the present invention will be explained in detail. As described above, magnitude of the strain of the SiGe layer of the SGOI wafer or the like is important for high-speed operation of the semiconductor device and, the strain can be larger by setting the Ge concentration to be higher.

However, the present inventors have focused attention that even when the Ge concentration is set to be high, if lattice relaxation of the SiGe layer becomes caused, the strain becomes small. If the lattice relaxation becomes caused as described above, it becomes impossible to obtain desired strain according to the Ge concentration even when the Ge concentration is set to be high for obtaining large strain.

Accordingly, the present inventors have investigated a method for solving the problem and producing an SGOI wafer or a GOI wafer with keeping the strain without causing lattice relaxation, and consequently, have found that when the SGOI wafer or the like is produced, an ion-implanted layer is formed inside a bond wafer by a bonding method using an ion implantation delamination method and a part of the wafer is also transferred as a Si layer in the delamination. It is found that if this is done, the SiGe layer is bound to crystal lattice of the Si layer and the lattice strain is not relaxed and therefore, when the bonding heat treatment is performed in the state at a temperature of more than or equal to a temperature in the delamination treatment, the bonded surfaces can be bounded with keeping the strain of the SiGe layer, and then because the Si layer is removed after the bonded surfaces are bound as described above, the lattice relaxation is also suppressed thereafter and, a wafer having a sufficiently strained SiGe layer. The present invention has been accomplished.

Hereinafter, the embodiment of the present invention will be explained. However, the present invention is not limited thereto.

FIG. 1 is a view showing a process for producing a semiconductor wafer according to an embodiment of the present invention.

First, as shown in FIG. 1(a), by a vapor growth method, a $Si_{1-X}Ge_X$ layer 2 ($0<X\leq1$) is epitaxially grown on a surface of a silicon single crystal wafer 1 to be a bond wafer. The thickness of the $Si_{1-X}Ge_X$ layer 2 can be appropriately controlled according to the Ge concentration and so forth. And, for example, the thickness can be 1 nm~20 nm. In this time, lattice strain (compression strain) is generated in the $Si_{1-X}Ge_X$ layer 2. X is sufficient to be a value at which the lattice strain is generated. However, for generating sufficient strain, it is preferable that X is 0.2 or more.

The vapor growth can be performed by CVD (Chemical Vapor Deposition) method or MBE (Molecular Beam Epitaxy) method and so on. In the case of CVD method, as the material gas, for example, $GeH_4$ can be used if X=1, and a mixed gas of $GeH_4$ and $SiH_4$ or $SiH_2Cl_2$ and so forth can be used if $0<X<1$. As the carrier gas, $H_2$ is used. As the growth condition, for example, the temperature may be 400~1000° C. and the pressure may be 100 Torr ($1.33\times10^4$ Pa) or less.

Next, as shown in FIG. 1(b), at least one kind of hydrogen ion and rare gas ion is implanted at a predetermined dose amount and an ion-implanted layer 3 is formed inside the silicon single crystal wafer 1. In this case, depth of the ion implantation depends on magnitude of the implantation energy and therefore, the implantation energy may be set so that the implantation depth becomes a desired depth.

Next, as shown in FIG. 1(c), a base wafer 4 of silicon single crystal in which a silicon oxide film 5 is formed on a surface thereof by, for example, thermal oxidation and so forth is prepared and, as shown in FIG. 1(d), a surface of the $Si_{1-X}Ge_X$ layer 2 and a surface of the base wafer 4 are closely contacted and bonded through a silicon oxide film 5 that is an insulator film at a room temperature. As the base wafer 4, as well as the above-described silicon single crystal wafer, an insulator wafer such as quartz, silicon carbide, alumina, and diamond. In this case, before the bonding at room temperature, generally, it is required to sufficiently clean the surfaces to be bonded. For example, in the case of performing the cleaning with a mixed aqueous solution (SC-1: Standard Cleaning 1) of $NH_4OH$ and $H_2O_2$, it is preferable to select a cleaning condition so that surface roughness of the surface of the $Si_{1-X}Ge_X$ layer in which the surface roughness is prone to be caused by an etching action in the cleaning with compared to Si is suppressed to be a minimum, such as setting the liquid temperature to be lower than that of a general case.

Next, as shown in FIG. 1(e), generally, by performing the delamination heat treatment at a temperature of 500° C., the delamination is performed so that the ion-implanted layer 3 serves as a cleavage plane. Thereby, the $Si_{1-X}Ge_X$ layer 2 and a part 6 of the silicon single crystal wafer 1 are transferred to the side of the base wafer as a delaminated layer. In the present invention, the Si layer 6 is also transferred to the side of the base wafer with the $Si_{1-X}Ge_X$ layer 2 as described above and therefore, the $Si_{1-X}Ge_X$ layer 2 is bound to Si crystal lattice of the Si layer 6 and the compression strain is kept, the lattice relaxation is not caused. In addition, as a pretreatment of a bonding step as shown in FIG. 1(d), the surfaces supplied to the close contact of the both wafers are plasma-treated and thereby, the strength of the close contact is enhanced, and the delamination can be mechanically performed at a low temperature such as approximately room temperature without performing delamination heat treatment after the close contact. Also, in this case, by existence of the Si layer 6, the compression strain of the $Si_{1-X}Ge_X$ layer 2 is kept.

The thickness of the Si layer 6 is determined according to the ion-implantation energy. However, it is preferable that the thickness of the Si layer 6 is more than or equal to five times a thickness of the $Si_{1-X}Ge_X$ layer 2. Thereby, the $Si_{1-X}Ge_X$ layer 2 is strongly bound to lattice of the Si layer 6 and the strain can be sufficiently kept. Moreover, the upper limit of the thickness can be appropriately determined according to the value X. However, 10 times or more is more preferable, and approximately 30 times is particularly preferable. Moreover, approximately 50 times is sufficient because the effect of keeping the strain does not change if more than 50 times.

Next, as shown in FIG. 1(f), the bonding heat treatment of binding the bonded surfaces at a temperature of, at least, more than or equal to a temperature in the delamination treatment as shown in FIG. 1(e). Thereby, it is possible that the binding strength of the bonding surfaces with binding the $Si_{1-X}Ge_X$ layer 2 to lattice of the Si layer 6 and therefore, the strain of the $Si_{1-X}Ge_X$ layer 2 can be sufficiently kept even when the Si layer 6 is thereafter removed.

In this case, the condition of the bonding heat treatment may be appropriately selected at a higher temperature than the room temperature according to Ge concentration or thickness of the $Si_{1-X}Ge_X$ layer 2. However, it is preferable that the bonding heat treatment is performed at a temperature of 500° C. or more that is a general delamination heat treatment temperature in the case of performing the delamination heat treatment, because the binding strength is enhanced and, there is not caused a problem which the bonding surfaces are corroded with an etching solution, for example, even in the case of thereafter removing the Si layer with an etching solution and, polishing failure becomes difficult to be caused even in the case of removing the Si layer by polishing. Moreover, it is more preferable that the treatment is performed at a temperature of 600° C. or more because the binding strength is more certainly enhanced. Moreover, when the treatment is performed at a temperature of 1100° C. or less, the diffusion velocity of Ge is low and therefore, diffusion of Ge of the $Si_{1-X}Ge_X$ layer 2 to the Si layer 6 is suppressed and, degradation of the Ge concentration of the $Si_{1-X}Ge_X$ layer 2 is suppressed and therefore, the strain is not reduced. Moreover, the interface of SiGe layer/Si layer is not broken and is clearly held and, the subsequent removal of the Si layer 6 can be suitably performed. Furthermore, the melting temperature of the $Si_{1-X}Ge_X$ is approximately 950° C. in the case of X=1 and, as the X becomes smaller, the melting temperature becomes higher. However, if the bonding heat treatment temperature is too high, Ge occasionally dissolves and recrystallizes and thereby, localizes and the crystallinity of the $Si_{1-X}Ge_X$ layer 2 becomes degraded. However, if 950° C. or less, such a problem is not caused even when the Ge concentration is high, and it is possible to certainly set the $Si_{1-X}Ge_X$ layer to have a high crystallinity and be uniform.

Moreover, the bonding heat treatment may be performed by a general resistance heating apparatus. However, it is preferable that the bonding heat treatment is performed by using an RTA apparatus by which rapid heating and rapid cooling are possible because diffusion of Ge can be certainly prevented and the strain is not reduced and also, the interface of SiGe layer/Si layer is not broken and is clearly maintained, and the subsequent removal of the Si layer can be suitably performed. In addition, the bonding heat treatment is performed so that the lattice relaxation is not caused and therefore, the treatment may be performed for approximately 5~20 min by the resistance heating apparatus and for approximately 10~60 sec by the RTA apparatus.

Last, as shown in FIG. 1(g), the Si layer 6 transferred to the side of the base wafer is removed. Because the $Si_{1-X}Ge_X$ layer 2 and the base wafer 4 are strongly bound by the bonding heat treatment, the lattice relaxation of the $Si_{1-X}Ge_X$ layer 2 is not caused also after the Si layer 6 is removed as described above, and, the strain can be sufficiently kept.

The removal can be performed by polishing, etching, or a combination thereof. In the case of removal by polishing, for example, a conventional CMP can be used. Moreover, etching is preferable because the removal can be performed uniformly and without surface roughness even when the $Si_{1-X}Ge_X$ layer is thin. Moreover, in this case, the etching solution is not limited as long as Si is more etched than $Si_{1-X}Ge_X$. However, TMAH (Tetramethyl ammonium hydroxide) can be used as the etching solution. With TMAH solution, the Si layer 6 is removed and, when the TMAH solution reaches the $Si_{1-X}Ge_X$ layer 2, the etching stops by selectivity of TMAH solution, and namely, etch stop occurs. Such an etch stop method is preferable because the Si layer 6 is certainly removed and the surface of the $Si_{1-X}Ge_X$ layer 2 becomes smooth. In particular, in the present invention, the heat treatment can be performed without diffusion of Ge in the bonding heat treatment and therefore, the interface of SiGe layer/Si layer is not broken and is clearly kept and therefore, the etch stop becomes more easily performed.

The SGOI wafer or the GOI wafer that is produced as described above has sufficiently large strain and does not cause lattice relaxation and has a $Si_{1-X}Ge_X$ layer having a low lattice relaxation rate and therefore, when a semiconductor device is fabricated on the $Si_{1-X}Ge_X$ layer, the semiconductor device comes to have a high carrier mobility and to have high-speed performance.

In addition, the lattice relaxation rate can be measured by, for example, an X-ray diffraction method or a Raman spectrometric method.

Hereinafter, the present invention will be specifically explained with reference to Example of the present invention and Comparative example. However, the present invention is not limited thereto.

Example 1

On a surface of a silicon single crystal wafer having a diameter of 200 mm, a Ge layer having a 100% Ge concentration was epitaxially grown by 10 nm by CVD method so that $GeH_4$ was used as the material gas and so that the growth temperature was set to be 600° C. and then, through the Ge layer, hydrogen ions ($H^+$) were ion-implanted in the condition that the implantation energy was 30 keV and that the dose amount was $6\times10^{16}$ ions/cm$^2$ and thereby, an ion-implanted layer was formed inside the silicon wafer. After the ion implantation of hydrogen ions, the surface of the Ge layer was cleaned with an SC-1 cleaning solution. In order to prevent surface roughness of the Ge layer, the cleaning was performed at 50° C. or less, which was a lower temperature than that of a general case. The surface and a silicon single crystal base wafer with a thermal oxide film of 145 nm were closely contacted and bonded at a room temperature, and the delamination heat treatment was performed under an argon atmosphere at 500° C. for 30 min and then, the delamination was performed at the ion-implanted layer formed at a depth of 310 nm from the bonded interface and, the Ge layer and a part (Si layer) of the silicon single crystal wafer were transferred to the side of the base wafer. That is, in this case, the thickness of the Si layer was 300 nm, which was 30 times a thickness of the Ge layer.

Next, the lattice relaxation rate of the Ge layer was measured by a Raman spectrometric method and thereby, the lattice relaxation rate was 2% and the lattice relaxation was hardly caused. Next, by an RTA apparatus, the bonding heat treatment at 900° C. for 30 sec was performed. Next, the Si layer was etched by an etch stop method using a TMAH solution and removed. In addition, selection ratio of the TMAH solution when the Ge concentration of the $Si_{1-X}Ge_X$ layer is 50% or more is 500 times. The solution temperature of the TMAH solution was 30° C. and in this case, the etching rate is 46 nm/min and therefore, the etching was performed for 8 min in order to remove the Si layer having a thickness of 300 nm.

In the GOI wafer produced by the above-described method, the Ge layer had a Ge concentration of 100% and had a thickness of 10 nm and, a silicon oxide film thickness was 145 nm. Moreover, the lattice relaxation rate of the Ge layer was measured by a Raman spectrometric method and thereby, the lattice relaxation rate was 2%, which hardly changed with compared to that before the bonding heat treatment, and therefore, it was confirmed that the Ge layer kept the intrinsic strain determined by Ge concentration. Moreover, For the surface roughness, RMS was 0.2 nm (measurement range was 10 μm×10 μm square) and the surface roughness was small, cross-hatch pattern was not seen on the surface.

Example 2

On a surface of a silicon single crystal wafer having a diameter of 200 mm, a $Si_{0.5}Ge_{0.5}$ layer having a 50% Ge concentration was epitaxially grown by 15 nm by CVD method so that $GeH_4$ and $SiH_4$ were used as the material gas and so that the growth temperature was set to be 600° C. and then, through the $Si_{0.5}Ge_{0.5}$ layer, hydrogen ions were ion-implanted in the condition that the implantation energy was 30 keV and that the dose amount was $6\times10^{16}$ ions/cm$^2$ and thereby, an ion-implanted layer was formed inside the silicon single crystal wafer. After the ion implantation of hydrogen ions, the surface of the $Si_{0.5}Ge_{0.5}$ layer was cleaned with an SC-1 cleaning solution at a temperature of 50° C. or less. The surface and a silicon single crystal base wafer with a thermal oxide film of 145 nm were closely contacted and bonded at a room temperature, and the delamination heat treatment was performed under an argon atmosphere at 500° C. for 30 min and then, the delamination was performed at the ion-implanted layer formed at a depth of 310 nm from the bonded interface and, the $Si_{0.5}Ge_{0.5}$ layer and a part (Si layer) of the silicon single crystal wafer were transferred to the side of the base wafer. That is, in this case, the thickness of the Si layer was 295 nm, which was approximately 19.7 times a thickness of the $Si_{0.5}Ge_{0.5}$ layer.

Next, the lattice relaxation rate of the Ge layer was measured by a Raman spectrometric method and thereby, the lattice relaxation rate was 1.5% and the lattice relaxation was hardly caused. Next, in an resistance heating furnace, the bonding heat treatment at 800° C. for 10 min was performed. Next, the Si layer was etched by an etch stop method using a TMAH solution and removed. In this case, in the same method as Example 1, the solution temperature of the TMAH solution was set to be 30° C. and, etching was performed for 8 min.

In the GOI wafer produced by the above-described method, the $Si_{0.5}Ge_{0.5}$ layer had a Ge concentration of 50% and had a thickness of 15 nm and, a silicon oxide film thickness was 145 nm. The lattice relaxation rate of the $Si_{0.5}Ge_{0.5}$ layer was measured by a Raman spectrometric method and thereby, the lattice relaxation was 1.5%, which hardly changed with compared to that before the bonding heat treatment, and therefore, it was confirmed that the $Si_{0.5}Ge_{0.5}$ layer kept the intrinsic strain determined by Ge concentration. Moreover, For the surface roughness, RMS was 0.2 nm (measurement range was 10 μm×10 μm square) and the surface roughness was small, cross-hatch pattern was not seen on the surface.

Comparative Example 1

By the same method as Example 1, on a surface of a silicon single crystal wafer having a diameter of 200 mm, a Ge layer having a 100% Ge concentration was epitaxially grown by 10 nm and then, an ion implantation delamination method was performed in the same condition as Example 1 and then, the Ge layer and a Si layer having a thickness of 300 nm were transferred to the side of the base wafer. The lattice relaxation rate of the Ge layer was measured by a Raman spectrometric method and thereby, the lattice relaxation was 2% as in the case of Example 1 and the lattice relaxation was hardly caused.

Next, the Si layer was etched by an etch stop method using a TMAH solution and removed and then, with an RTA apparatus, the bonding heat treatment was performed in the same condition as Example 1.

The lattice relaxation rate of the Ge layer of the GOI wafer produced by the above-described method was measured by a Raman spectrometric method and thereby, the lattice relaxation rate was approximately 20% and therefore, it was confirmed that lattice relaxation was caused by the bonding heat treatment.

The present invention is not limited to the above-described embodiments. The above-described embodiments are mere examples, and those having the substantially same constitution as that described in the appended claims and providing the similar action and advantages are included in the scope of the present invention.

The invention claimed is:
1. A method for producing a semiconductor wafer, comprising:
epitaxially growing a $Si_{1-X}Ge_X$ layer ($0<X\leq1$) having lattice strain on a surface of a silicon single crystal wafer to be a bond wafer;

implanting at least one kind of a hydrogen ion or a rare gas ion through the $Si_{1-x}Ge_x$ layer to form an ion-implanted layer inside the bond wafer;

closely contacting and bonding a surface of the $Si_{1-x}Ge_x$ layer and a surface of a base wafer through an insulator film; then performing delamination at the ion-implanted layer;

performing a bonding heat treatment of binding the bonded surfaces at a temperature of, at least, more than or equal to a temperature when the delamination is performed; and then removing a Si layer of a delaminated layer transferred to a side of the base wafer by the delamination;

wherein lattice strain is maintained in the $Si_{1-x}Ge_x$ layer.

2. The method for producing a semiconductor wafer according to claim 1, wherein a thickness of the Si layer of the delaminated layer is more than or equal to five times a thickness of the $Si_{1-x}Ge_x$ layer.

3. The method for producing a semiconductor wafer according to claim 1, wherein the bonding heat treatment is performed at a temperature of 500° C. to 1100° C.

4. The method for producing a semiconductor wafer according to claim 2, wherein the bonding heat treatment is performed at a temperature of 500° C. to 1100° C.

5. The method for producing a semiconductor wafer according to claim 1, wherein the bonding heat treatment is performed at a temperature of 600° C. to 950° C.

6. The method for producing a semiconductor wafer according to claim 2, wherein the bonding heat treatment is performed at a temperature of of 600° C. to 950° C.

7. The method for producing a semiconductor wafer according to claim 1, wherein the bonding heat treatment is performed by using an RTA apparatus.

8. The method for producing a semiconductor wafer according to claim 2, wherein the bonding heat treatment is performed by using an RTA apparatus.

9. The method for producing a semiconductor wafer according to claim 1, wherein the Si layer of the delaminated layer is removed by etching.

10. The method for producing a semiconductor wafer according to claim 2, wherein the Si layer of the delaminated layer is removed by etching.

11. The method for producing a semiconductor wafer according to claim 4, wherein the Si layer of the delaminated layer is removed by etching.

12. The method for producing a semiconductor wafer according to claim 6, wherein the Si layer of the delaminated layer is removed by etching.

13. The method for producing a semiconductor wafer according to claim 8, wherein the Si layer of the delaminated layer is removed by etching.

* * * * *